United States Patent
Lee et al.

(10) Patent No.: US 9,263,112 B2
(45) Date of Patent: Feb. 16, 2016

(54) SEMICONDUCTOR INTEGRATED CIRCUIT

(71) Applicant: SK hynix Inc., Icheon-si Gyeonggi-do (KR)

(72) Inventors: Dong Uk Lee, Icheon-si (KR); Kyung Whan Kim, Icheon-si (KR); Dae Suk Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 15 days.

(21) Appl. No.: 14/268,681

(22) Filed: May 2, 2014

(65) Prior Publication Data

US 2015/0092484 A1   Apr. 2, 2015

(30) Foreign Application Priority Data

Sep. 30, 2013 (KR) .................. 10-2013-0116686

(51) Int. Cl.
| | |
|---|---|
| G11C 11/34 | (2006.01) |
| G11C 8/18 | (2006.01) |
| G11C 7/10 | (2006.01) |
| G11C 5/02 | (2006.01) |
| G11C 5/06 | (2006.01) |
| G11C 7/22 | (2006.01) |
| G11C 8/12 | (2006.01) |
| G06F 12/06 | (2006.01) |

(52) U.S. Cl.
CPC .............. *G11C 8/18* (2013.01); *G06F 12/0607* (2013.01); *G11C 5/025* (2013.01); *G11C 5/063* (2013.01); *G11C 7/1006* (2013.01); *G11C 7/109* (2013.01); *G11C 7/1045* (2013.01); *G11C 7/1051* (2013.01); *G11C 7/1072* (2013.01); *G11C 7/1078* (2013.01); *G11C 7/22* (2013.01); *G11C 8/12* (2013.01); *G06F 2212/1016* (2013.01)

(58) Field of Classification Search
CPC .... G11C 11/39; G11C 11/412; G11C 7/1051; G11C 7/1078; G11C 7/1006; G11C 7/1072; G11C 7/22
USPC .................. 365/174, 189.05, 230.08
See application file for complete search history.

(56) References Cited

U.S. PATENT DOCUMENTS

| | | | | |
|---|---|---|---|---|
| 6,445,603 | B1 * | 9/2002 | Abedifard ...................... | 365/51 |
| 6,569,727 | B1 * | 5/2003 | Casper et al. ................. | 438/210 |
| 6,728,851 | B1 * | 4/2004 | Estakhri et al. ............... | 711/168 |
| 7,085,152 | B2 * | 8/2006 | Ellis et al. ..................... | 365/149 |
| 8,879,351 | B2 * | 11/2014 | Kim ......................... | 365/230.06 |

FOREIGN PATENT DOCUMENTS

KR        101026582 B1       3/2011

* cited by examiner

*Primary Examiner* — Pho M Luu
(74) *Attorney, Agent, or Firm* — William Park & Associates Ltd.

(57) ABSTRACT

A plurality of memory blocks; and a control block configured to independently operate a part of the plurality of memory banks as a first sub-channel and a remainder of the plurality of memory banks as a second sub-channel according to whether a sub-channel is set.

17 Claims, 9 Drawing Sheets

SEMICONDUCTOR INTEGRATED CIRCUIT

CROSS-REFERENCES TO RELATED APPLICATION

The present application claims priority under 35 U.S.C. §119(a) to Korean application number 10-2013-0116686, filed on Sep. 30, 2013, in the Korean Intellectual Property Office, which is incorporated herein by reference in its entirety.

BACKGROUND

1. Technical Field

Various embodiments relate to a semiconductor circuit, and more particularly, to semiconductor integrated circuit.

2. Related Art

A semiconductor integrated circuit can be manufactured in a multi-channel structure having independent address/command and data buses in order to reduce random access time.

Figure 1:
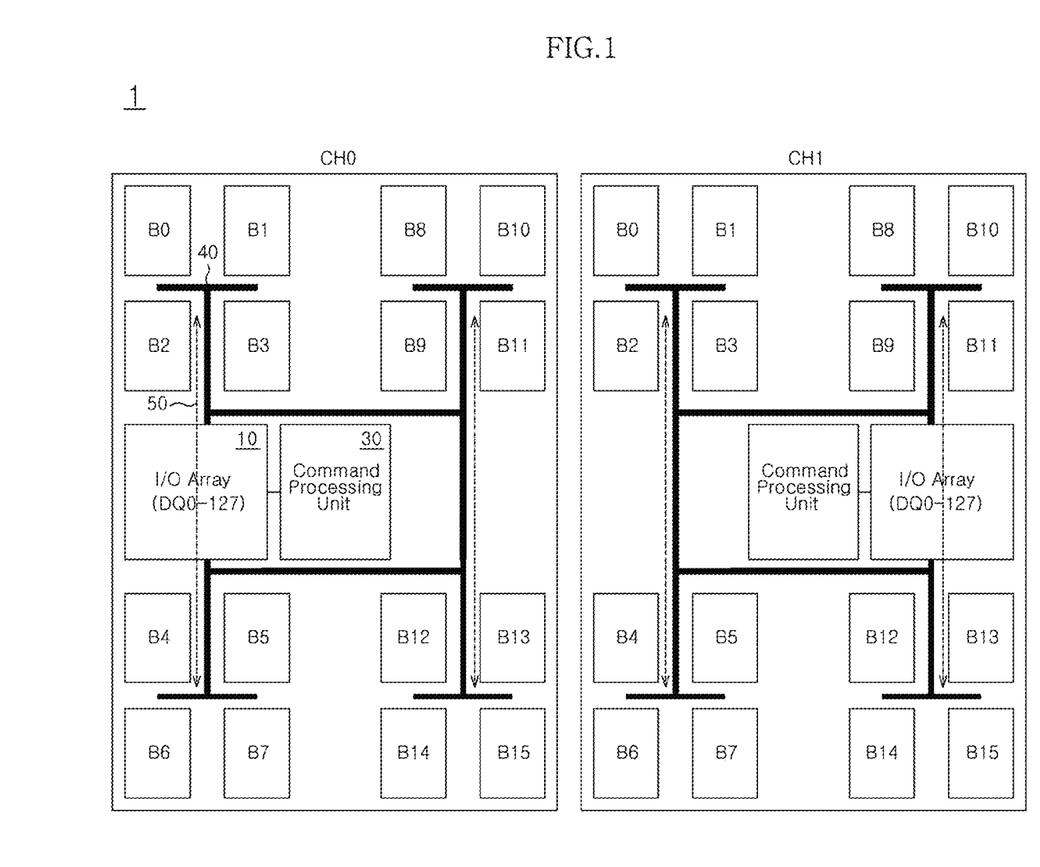
FIG. 1 is a layout view of a conventional semiconductor integrated circuit.

As shown in FIG. 1, a conventional semiconductor integrated circuit 1 may be configured to have two channels CH0 and CH1 as an example.

The two channels may be configured in the same manner.

The channel CH0 includes a plurality of memory blocks, e.g. a plurality of memory banks (hereinafter, referred to as "banks") B0-B15, an input/output array 10, a command processing unit 30, a data bus 40, and a command bus 50.

The plurality of banks B0-B15 share the input/output array 10 with each other.

The command processing unit 30 controls the read/write operations with respect to the plurality of banks B0-B15 through the command bus 50 in response to an external command.

When a burst length is four (BL=4), in order to access mutually different banks in regular sequence in an operation of an access write/read precharge scheme, the conventional semiconductor integrated circuit 1 requires a timing margin of 3tCK so as to be accorded with a Row to Row Delay (tRRD) standard.

Figure 2:
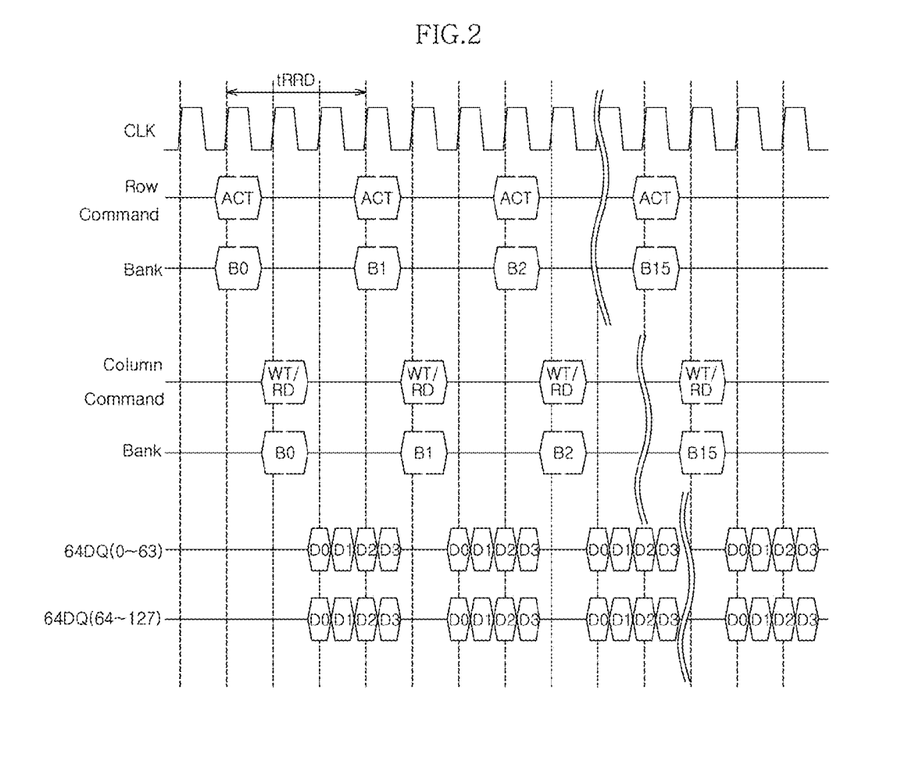
FIG. 2 is a timing view showing an operation implemented in FIG. 1.

Therefore, as shown in FIG. 2, in order to output data of mutually different banks, a gap of 3tCK necessarily exists, thereby causing a loss of bandwidth.

In the conventional semiconductor integrated circuit 1, since the plurality of memory banks B0-B7 share the input/output array 10, as described above, input/output lines increase, and thus it is difficult to make an arrangement of the input/output lines.

In addition, on data output from mutually different banks, in order to be accorded with the tRRD standard, a timing margin is reduced and a loss of bandwidth is caused.

SUMMARY

A semiconductor integrated circuit enabling the layout thereof to be easily achieved and having an increased timing margin is described herein.

In an embodiment of the present invention, a system may include a plurality of memory banks; and a control block configured to independently operate a part of the plurality of memory banks as a first sub-channel and a remainder of the plurality of memory banks as a second sub-channel according to whether a sub-channel is set.

In an embodiment of the present invention, a system may include one or more channels, wherein each of the one or more channels comprises: a first sub-channel configured to have a plurality of memory blocks; and a second sub-channel configured to have a plurality of memory blocks, wherein the first and second sub-channels are configured to share commands and addresses with each other and to have independent input/output arrays, respectively.

BRIEF DESCRIPTION OF THE DRAWINGS

Features, aspects, and embodiments are described in conjunction with the attached drawings, in which.

DETAILED DESCRIPTION

Hereinafter, a semiconductor integrated circuit according to the present invention will be described below with reference to the accompanying drawings through various embodiments.

Figure 3:
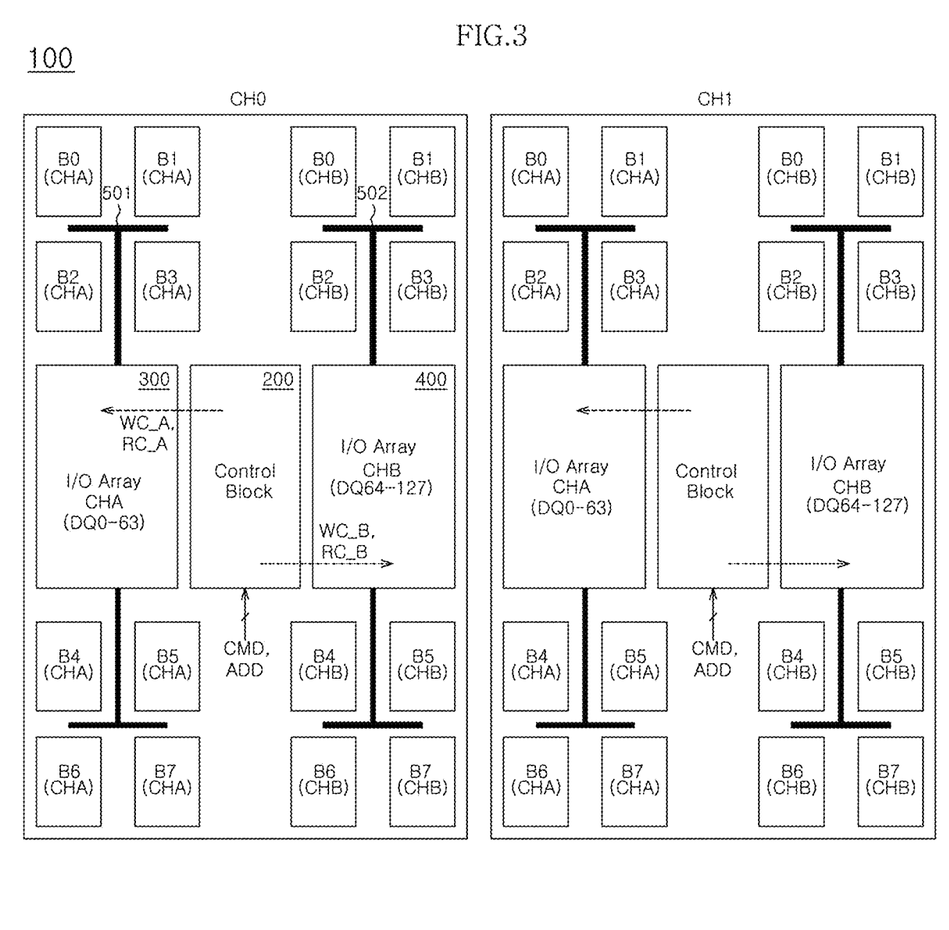
FIG. 3 is a layout view illustrating the configuration of a semiconductor integrated circuit according to an embodiment of the present invention.

As illustrated in FIG. 3, a semiconductor integrated circuit 100 according to an embodiment of the present invention may be configured, for example, to have two channels CH0 and CH1.

The two channels CH0 and CH1 may be configured in the same manner.

Each of the two channels CH0 and CH1 may have sub-channels.

The channel CH0 may include a first sub-channel CHA and a second sub-channel CHB.

The first sub-channel CHA and the second sub-channel CHB may share commands CMD and addresses ADD with each other, and have independent input/output arrays, i.e. a first sub-channel input/output array 300 and a second sub-channel input/output array 400, respectively.

The first sub-channel CHA may include a plurality of memory banks (hereinafter, referred to as "banks") B0-B7, a first sub-channel input/output array 300, and a data bus 501.

The second sub-channel CHB may include a plurality of banks B0-B7, a second sub-channel input/output array 400, and a data bus 502.

The first sub-channel input/output array 300 may be configured to process the data input/output DQ0-63 of the plurality of banks B0-B7 of the first sub-channel CHA through the data bus 501.

The second sub-channel input/output array 400 may be configured to process the data input/output DQ64-127 of the plurality of banks B0-B7 of the second sub-channel CHB through the data bus 502.

The control block 200 may be configured to independently control the read/write operation of the first sub-channel CHA and the read/write operation of the second sub-channel CHB in accordance with a command CMD, an address ADD, and whether a sub-channel is set.

Figure 4:
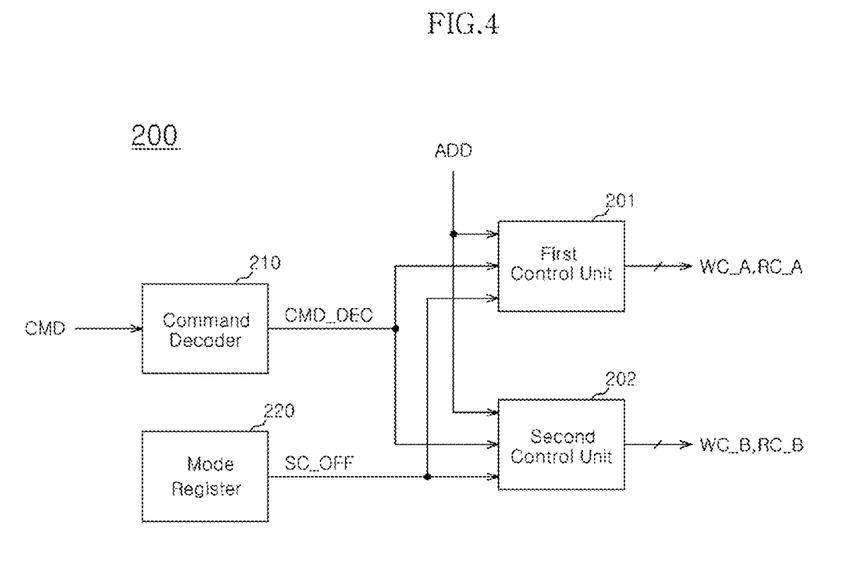
FIG. 4 is a block diagram illustrating the internal configuration of a control block capable of being implemented in the view of FIG. 3.

As illustrated in FIG. 4, the control block 200 may include a command decoder 210, a mode register 220, a first controller 201, and a second controller 202.

The command decoder 210 may be configured to decode a command CMD and to output a decoded command CMD_DEC.

The mode register 220 may be configured to output a sub-channel setup signal SC_OFF determining whether or not a sub-channel is set.

In this case, the sub-channel setup signal SC_OFF may vary depending on an external control.

The first controller 201 and the second controller 202 may be configured to share the decoded command CMD_DEC, an address ADD, and the sub-channel setup signal SC_OFF with each other.

The first controller 201 may be configured to generate a first sub-channel write control signal WC_A and a first sub-channel read control signal RC_A in response to the decoded command CMD_DEC, the address ADD, and the sub-channel setup signal SC_OFF.

The second controller 202 may be configured to generate a second sub-channel write control signal WC_B and a second sub-channel read control signal RC_B in response to the decoded command CMD_DEC, the address ADD, and the sub-channel setup signal SC_OFF.

The first sub-channel write control signal WC_A may be a signal for controlling the write operations of the plurality of banks B0-B7 in the first sub-channel CHA.

The second sub-channel write control signal WC_B may be a signal for controlling the write operations of the plurality of banks B0-B7 in the second sub-channel CHB.

Figure 5:
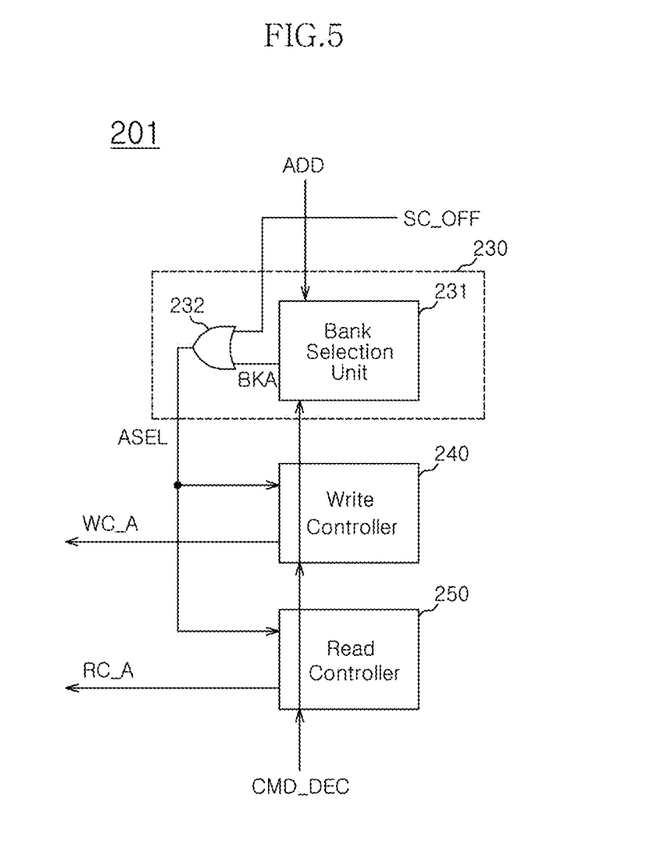
FIG. 5 is a block diagram illustrating the internal configuration of a first controller capable of being implemented in the view of FIG. 4.

As illustrated in FIG. 5, the first controller 201 may include a sub-channel selection unit 230, a write controller 240, and a read controller 250.

The sub-channel selection unit 230 may be configured to combine a bank selection signal BKA, which is generated according to the decoded command CMD_DEC and the address ADD, with the sub-channel setup signal SC_OFF and to generate a sub-channel selection signal ASEL.

In this case, the address ADD may include a bank address BA.

When the sub-channel setup signal SC_OFF is at a high level, that is to say, when the semiconductor integrated circuit 100 operates in a normal mode, i.e. a mode in which a sub-channel is not used, the sub-channel selection unit 230 activates the sub-channel selection signal ASEL, regardless of the bank selection signal BKA.

When the sub-channel setup signal SC_OFF is at a low level, that is to say, when the semiconductor integrated circuit 100 operates in a sub-channel mode, the sub-channel selection unit 230 activates the sub-channel selection signal ASEL when the bank selection signal BKA is activated.

The sub-channel selection unit 230 may include a bank selection unit 231 and a logic gate 232.

The bank selection unit 231 may be configured to generate a bank selection signal BKA in response to the decoded command CMD_DEC and the address ADD.

The logic gate 232 may be configured to perform an OR operation on the bank selection signal BKA and the sub-channel setup signal SC_OFF and to generate the sub-channel selection signal ASEL.

The write controller 240 may be configured to generate a first sub-channel write control signal WC_A in response to the decoded command CMD_DEC and the sub-channel selection signal ASEL.

The read controller 250 may be configured to generate a first sub-channel read control signal RC_A in response to the decoded command CMD_DEC and the sub-channel selection signal ASEL.

Figure 6:
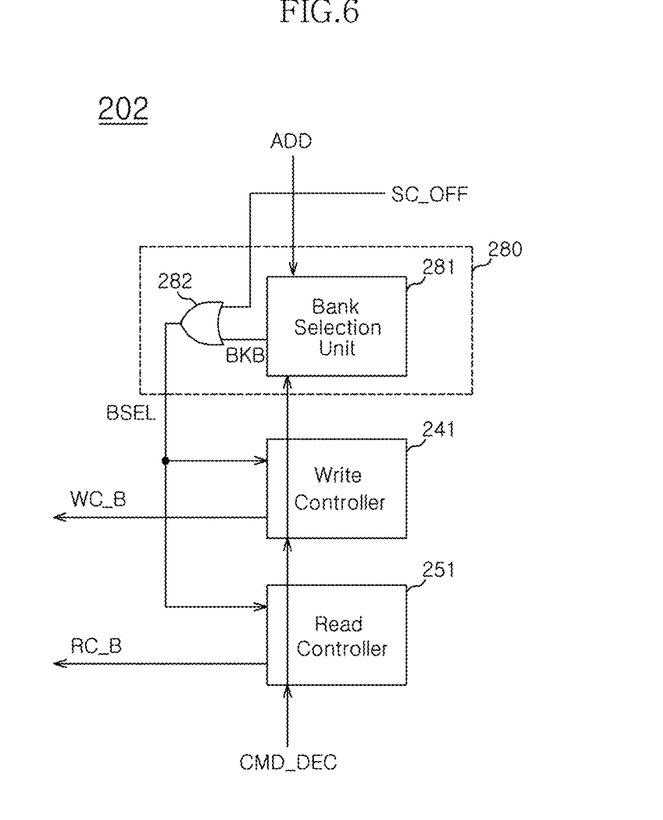
FIG. 6 is a block diagram illustrating the internal configuration of a second controller capable of being implemented in the view of FIG. 4.

As illustrated in FIG. 6, the second controller 202 may include a sub-channel selection unit 280, a write controller 241, and a read controller 251.

The sub-channel selection unit 280 may be configured to combine a bank selection signal BKB, which is generated according to the decoded command CMD_DEC and the address ADD, with the sub-channel setup signal SC_OFF and to generate a sub-channel selection signal BSEL.

In this case, the address ADD may include a bank address BA.

When the sub-channel setup signal SC_OFF is at a high level, that is to say, when the semiconductor integrated circuit 100 operates in a normal mode, i.e. a mode in which a sub-channel is not used, the sub-channel selection unit 280 activates the sub-channel selection signal BSEL, regardless of the bank selection signal BKB.

When the sub-channel setup signal SC_OFF is at a low level, that is to say, when the semiconductor integrated circuit 100 operates in a sub-channel mode, the sub-channel selection unit 280 activates the sub-channel selection signal BSEL when the bank selection signal BKB is activated.

The sub-channel selection unit 280 may include a bank selection unit 281 and a logic gate 282.

The bank selection unit 281 may be configured to generate a bank selection signal BKB in response to the decoded command CMD_DEC and the address ADD.

The logic gate 282 may be configured to perform an OR operation on the bank selection signal BKB and the sub-channel setup signal SC_OFF and to generate the sub-channel selection signal BSEL.

The write controller 241 may be configured to generate a second sub-channel write control signal WC_B in response to the decoded command CMD_DEC and the sub-channel selection signal BSEL.

The read controller 251 may be configured to generate a second sub-channel read control signal RC_B in response to the decoded command CMD_DEC and the sub-channel selection signal BSEL.

The operation of the semiconductor integrated circuit 100 configured as above according to an embodiment of the present invention will be described below with reference to FIG. 7.

Figure 7:
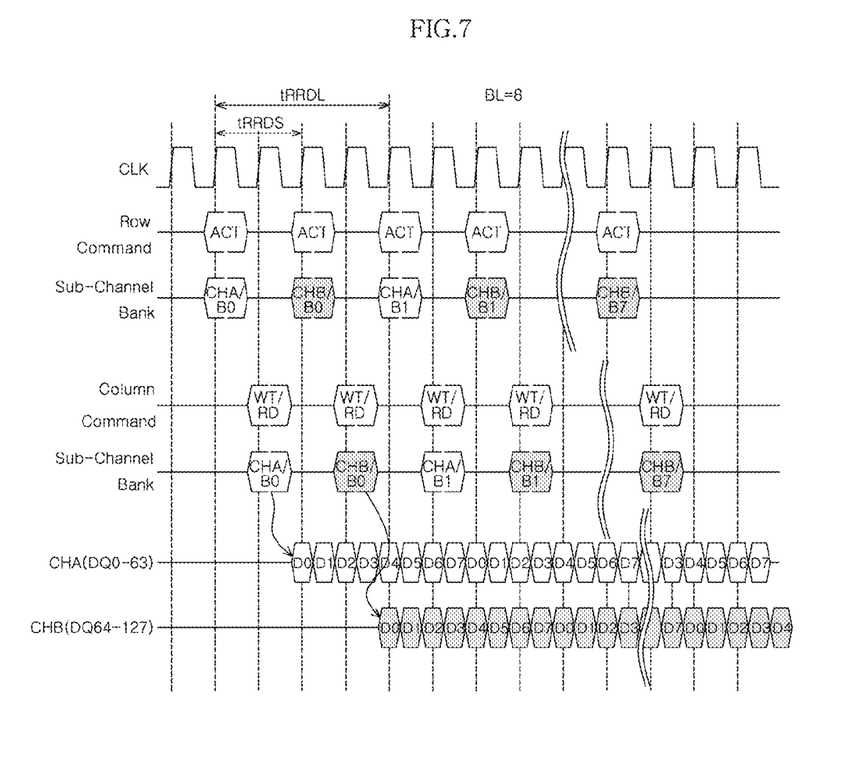
FIG. 7 is a timing view illustrating an operation capable of being implemented in the view of FIG. 3.

FIG. 7 is a view illustrating the operation of the semiconductor integrated circuit 100 when a burst length is eight (BL=8).

Row commands, i.e. active commands ACT, are inputted as commands CMD in regular sequence, and accordingly, the plurality of banks B0-B7 of the first sub-channel CHA and the plurality of banks B0-B7 of the second sub-channel CHB may be alternately row active one by one in an interleave manner.

That is to say, the banks may be row active in order of CHA/B0, CHB/B0, . . . , CHA/B7, and CHB/B7.

Since a write or read command is inputted after an active command ACT, a write or read of data D0-D7 with respect to the plurality of banks B0-B7 of the first sub-channel CHA and the plurality of banks B0-B7 of the second sub-channel CHB can be achieved, without a timing gap (i.e. in a gapless form), in a row-active order.

With respect to the DQ0-63 of the plurality of banks B0-B7 of the first sub-channel CHA and the DQ64-127 of the plurality of banks B0-B7 and the second sub-channel CHB, corresponding data write or read can be achieved.

According to an embodiment of the present invention, it is possible in one channel CH0 to operate the first sub-channel CHA and the second sub-channel CHB in an interleave manner.

Accordingly, a tRRDS (2tCK) may be applied for a tRRD between the first sub-channel CHA and the second sub-channel CHB, and a tRRDL (3tCK or greater) may be applied for a tRRD within an equal sub-channel, wherein a clock CLK diagram is illustrated.

In this case, on the basis of a conventional example, the tRRDS may mean a Row to Row Delay Short which is shorter than the tRRD of FIG. 2, and the tRRDL may mean a Row to Row Delay Long which is longer than the tRRD of FIG. 2.

Accordingly, a timing gap between data accesses is not generated because a row active gap can be reduced, and thus a loss of bandwidth can be prevented.

Figure 8:
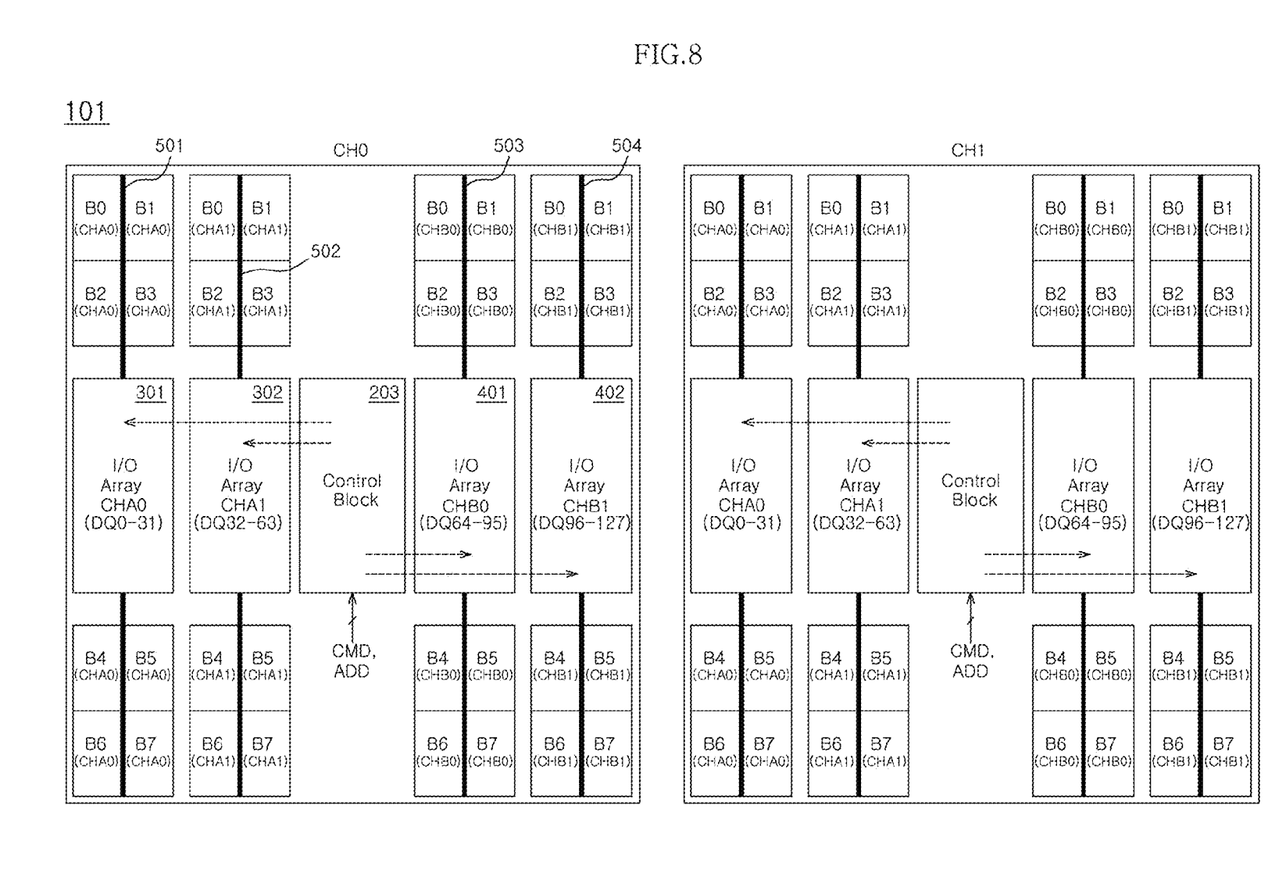
FIG. 8 is a layout view illustrating the configuration of a semiconductor integrated circuit according to an embodiment of the present invention.

As shown in FIG. 8, a semiconductor integrated circuit 101 according to an embodiment of the present invention may be configured, for example, to have two channels CH0 and CH1.

The two channels CH0 and CH1 may be configured in the same manner.

Each of the two channels CH0 and CH1 may have four sub-channels.

The channel CH0 may include first to fourth sub-channels CHA0 to CHB1, respectively.

The first to fourth sub-channels CHA0 to CHB1 share commands CDM and addresses ADD with each other, and have independent input/output arrays, i.e. first to fourth sub-channel input/output arrays 301-402, respectively.

The first sub-channel CHA0 may include a plurality of banks B0-B7, a first sub-channel input/output array 301, and a data bus 501.

The second sub-channel CHA1 may include a plurality of banks B0-B7, a second sub-channel input/output array 302, and a data bus 502.

The third sub-channel CHB0 may include a plurality of banks B0-B7, a third sub-channel input/output array 401, and a data bus 503.

The fourth sub-channel CHB1 may include a plurality of banks B0-B7, a fourth sub-channel input/output array 402, and a data bus 504.

The first sub-channel input/output array 301 may be configured to process the data input/output DQ0-31 of the plurality of banks B0-B7 of the first sub-channel CHA0 through the data bus 501.

The second sub-channel input/output array 302 may be configured to process the data input/output DQ32-63 of the plurality of banks B0-B7 of the second sub-channel CHA1 through the data bus 502.

The third sub-channel input/output array 401 may be configured to process the data input/output DQ64-95 of the plurality of banks B0-B7 of the third sub-channel CHB0 through the data bus 503.

The fourth sub-channel input/output array 402 may be configured to process the data input/output DQ96-127 of the plurality of banks B0-B7 of the fourth sub-channel CHB1 through the data bus 504.

A control block 203 may be configured to independently control the read/write operation of each of the first to fourth sub-channels CHA0-CHB1 in accordance with a command CMD, an address, and whether a sub-channel is set.

This technology can improve the operating performance, facilitate a layout, and increase a timing margin.

Figure 9:
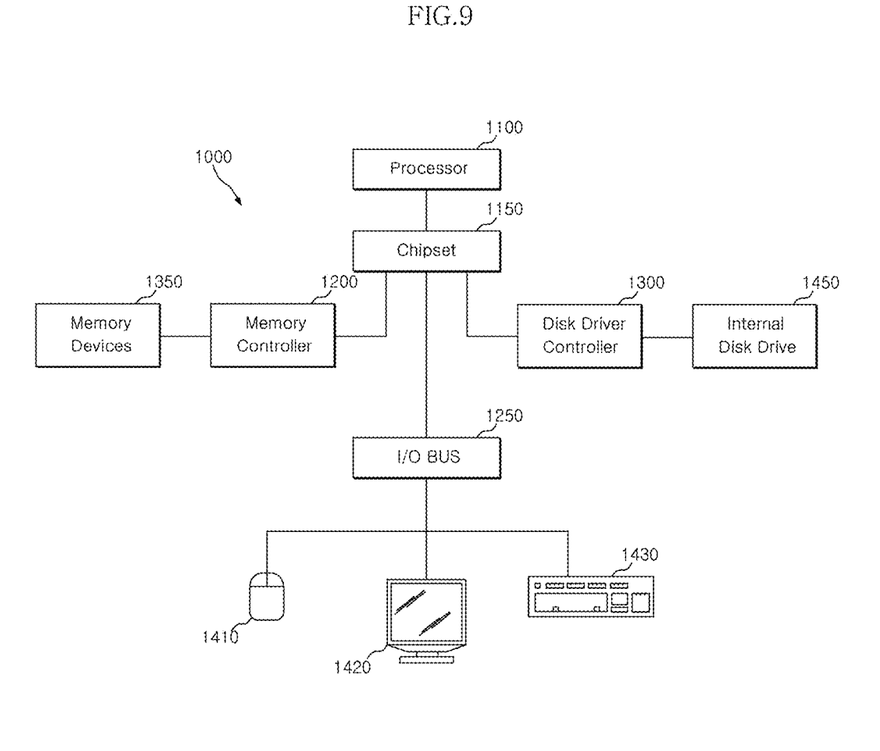
FIG. 9 illustrates a block diagram of a system employing a memory controller circuit in accordance with embodiments of the present invention.

Referring to FIG. 9, a system 1000 may include one or more processors or central processing units ("CPUs") 1100. The processor 1100 may be used individually or in combination with other processors.

A chipset may be operably coupled to the processor 1100. The chipset 1150 is a communication pathway for signals between the processor 1100 and other components of the system 1000, which may include a memory controller 1200, an input/output ("I/O") bus 1250, and a disk drive controller 1300. Depending on the configuration of the system, any one of a number of different signals may be transmitted through the chipset 1150.

The memory controller 1200 may be operably coupled to the chipset 1150. The memory controller 1200 may include at least one memory controller. The memory controller 1200 can receive a request provided from the processor 1100, through the chipset 1150. The memory controller 1200 may be operably coupled to one or more memory devices 1350. The memory devices 1350 may include the semiconductor integrated circuit 100 described above.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be operably coupled to the chipset 1150. The disk drive controller 1300 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

While certain embodiments have been described above, it will be understood to those skilled in the art that the embodiments described are by way of example only. Accordingly, the circuit described herein should not be limited based on the described embodiments. Rather, the circuit described herein should only be limited in light of the claims that follow when taken in conjunction with the above description and accompanying drawings.

What is claimed is:

1. A semiconductor integrated circuit comprising:
   a plurality of memory banks; and
   a control block configured to independently operate a part of the plurality of memory banks as a first sub-channel and a remainder of the plurality of memory banks as a second sub-channel according to a sub-channel setup signal.

2. The semiconductor integrated circuit according to claim 1, wherein the first and second sub-channels are configured to share commands and addresses with each other and to have independent input/output arrays, respectively.

3. The semiconductor integrated circuit according to claim 1, wherein the semiconductor integrated circuit is configured to process a part of input/output data according to a write/read operation through the first sub-channel, and to process the remainder of the input/output data through the second sub-channel.

4. The semiconductor integrated circuit according to claim 1, wherein the semiconductor integrated circuit is configured to alternately activate the memory blocks of the first sub-channel and the memory blocks of the second sub-channel one by one in response to an active command.

5. The semiconductor integrated circuit according to claim 1, wherein the control block is configured to recognize the first sub-channel and the second sub-channel as one channel or as independent channels in response to an address, a command, and the sub-channel setup signal, and to control a write/read operation.

6. The semiconductor integrated circuit according to claim 1, wherein the control block comprises:
    a command decoder configured to decode and output a command;
    a first controller configured to generate a first sub-channel write control signal and a first sub-channel read control signal in response to an output of the command decoder, an address, and the sub-channel setup signal; and
    a second controller configured to generate a second sub-channel write control signal and a second sub-channel read control signal in response to the output of the command decoder, the address, and the sub-channel setup signal.

7. The semiconductor integrated circuit according to claim 6, wherein the first controller comprises:
    a sub-channel selection unit configured to combine bank selection signals, which have been generated according to an output of the command decoder and the address, with the sub-channel setup signal, and to generate sub-channel selection signals;
    a write controller configured to generate the first sub-channel write control signal in response to the output of the command decoder and the sub-channel selection signals; and
    a read controller configured to generate the first sub-channel read control signal in response to the output of the command decoder and the sub-channel selection signals.

8. The semiconductor integrated circuit according to claim 7, wherein the sub-channel selection unit is configured to activate the sub-channel selection signals, regardless of the bank selection signals, when the sub-channel setup signal has a level defining the first sub-channel and the second sub-channel as one channel.

9. The semiconductor integrated circuit according to claim 7, wherein the sub-channel selection unit is configured to activate the sub-channel selection signals during activation of the bank selection signals when the sub-channel setup signal has a level defining the first sub-channel and the second sub-channel as independent channels.

10. A semiconductor integrated circuit comprising:
    one or more channels,
    wherein each of the one or more channels comprises:
    a first sub-channel configured to have a plurality of memory blocks;
    a second sub-channel configured to have a plurality of memory blocks; and
    a control block configured to recognize the first sub-channel and the second sub-channel as one channel or as independent channels in response to a sub-channel setup signal,
    wherein the first and second sub-channels are configured to share commands and addresses with each other and to have independent input/output arrays, respectively.

11. The semiconductor integrated circuit according to claim 10, wherein the semiconductor integrated circuit is configured to process a part of input/output data according to a write/read operation through the first sub-channel, and to process the remainder of the input/output data through the second sub-channel.

12. The semiconductor integrated circuit according to claim 10, wherein the semiconductor integrated circuit is configured to alternately activate the plurality of memory blocks of the first sub-channel and the plurality of memory blocks of the second sub-channel one by one in response to an active command.

13. The semiconductor integrated circuit according to claim 10, wherein the control block is configured to recognize the first sub-channel and the second sub-channel as one channel or as independent channels in response to the address, the command, and the sub-channel setup signal, and to control a write/read operation.

14. The semiconductor integrated circuit according to claim 10, wherein the control block comprises:
    a command decoder configured to decode and output the command;
    a first controller configured to generate a first sub-channel write control signal and a first sub-channel read control signal in response to an output of the command decoder, the address, and the sub-channel setup signal; and
    a second controller configured to generate a second sub-channel write control signal and a second sub-channel read control signal in response to the output of the command decoder, the address, and the sub-channel setup signal.

15. The semiconductor integrated circuit according to claim 14, wherein the first controller comprises:
    a sub-channel selection unit configured to combine bank selection signals, which have been generated according to the output of the command decoder and the address, with the sub-channel setup signal, and to generate sub-channel selection signals;
    a write controller configured to generate the first sub-channel write control signal in response to the output of the command decoder and the sub-channel selection signals; and
    a read controller configured to generate the first sub-channel read control signal in response to the output of the command decoder and the sub-channel selection signals.

16. The semiconductor integrated circuit according to claim 15, wherein the sub-channel selection unit is configured to activate all the sub-channel selection signals, regardless of the bank selection signals, when the sub-channel setup signal has a level defining the plurality of memory banks of the first sub-channel and the plurality of memory banks of the second sub-channel as one channel.

17. The semiconductor integrated circuit according to claim 15, wherein the sub-channel selection unit is configured to selectively activate the sub-channel selection signals depending on an activated signal of the bank selection signals when the sub-channel setup signal has a level defining the plurality of memory banks of the first sub-channel and the plurality of memory banks of the second sub-channel as independent channels.

* * * * *